(12) United States Patent
Smith et al.

(10) Patent No.: US 6,836,429 B2
(45) Date of Patent: Dec. 28, 2004

(54) MRAM HAVING TWO WRITE CONDUCTORS

(75) Inventors: Kenneth K. Smith, Boise, ID (US); Kenneth J. Eldredge, Boise, ID (US)

(73) Assignee: Hewlett-Packard Development Company, L.P., Houston, TX (US)

(*) Notice: Subject to any disclaimer, the term of this patent is extended or adjusted under 35 U.S.C. 154(b) by 132 days.

(21) Appl. No.: 10/314,114

(22) Filed: Dec. 7, 2002

(65) Prior Publication Data

US 2004/0109346 A1 Jun. 10, 2004

(51) Int. Cl.$^7$ ................................................ G11C 11/00
(52) U.S. Cl. ........................... 365/158; 365/63; 365/66
(58) Field of Search ............................. 365/158, 63, 66

(56) References Cited

U.S. PATENT DOCUMENTS

| | | | |
|---|---|---|---|
| 6,188,615 B1 | 2/2001 | Perner et al. | 365/189.01 |
| 6,259,644 B1 | 7/2001 | Tran et al. | 365/209 |
| 6,262,625 B1 | 7/2001 | Perner et al. | 330/2 |
| 6,363,000 B2 | 3/2002 | Perner et al. | 385/66 |
| 6,385,083 B1 | 5/2002 | Sharma et al. | 385/171 |
| 6,577,529 B1 * | 6/2003 | Sharma et al. | 365/158 |
| 2003/0007395 A1 * | 1/2003 | Stephenson et al. | 365/200 |
| 2004/0001368 A1 * | 1/2004 | Huggins | 365/200 |

* cited by examiner

*Primary Examiner*—Hoai Ho

(57) ABSTRACT

A magnetic random-access memory (MRAM) cell according to an embodiment of the invention is disclosed that comprises a magnetic storage element having an easy axis and a hard axis, a write conductor positioned along one of the easy axis and the hard axis, and a write conductor positioned at a non-parallel and non-perpendicular angle to both of the easy axis and the hard axis.

12 Claims, 6 Drawing Sheets

MRAM HAVING TWO WRITE CONDUCTORS

BACKGROUND OF THE INVENTION

Magnetic random-access memory (MRAM) is a non-volatile memory. Performing read and write operations in MRAM devices is orders of magnitude faster than performing read and write operations in conventional long-term storage devices, such as hard disk drives. Furthermore, MRAM devices are more compact and consume less power than hard disk drives and other conventional long-term storage devices.

A typical MRAM device includes an array of memory cells. Word lines extend along rows of the memory cells, and bit lines extend along columns of the memory cells. Each memory cell is thus located at a cross-point of a word line and a bit line. The memory cell stores a bit of information as an orientation of a magnetization. The magnetization of each memory cell may have one of two stable orientations at any given time, parallel and anti-parallel, which correspond to logical values of zero and one.

To change the value stored at a desired memory cell, the appropriate word and bit lines are biased to switch the magnetic orientation of the memory cell. Because each line crosses over a number of memory cells, the word and bit lines are carefully biased so only the desired memory cell, at the cross-point of the word and bit lines, has its magnetic orientation switched. Such selectivity can be difficult to accomplish, however, although it is nevertheless important for implementing accurate and reliable MRAM devices.

SUMMARY OF THE INVENTION

A magnetic random-access memory (MRAM) cell according to an embodiment of the invention comprises a magnetic storage element, and two write conductors. The magnetic storage element has an easy axis and a hard axis. One of the write conductors is positioned along one of the easy axis and the hard axis. The other write conductor is positioned at a non-parallel and non-perpendicular angle to both the easy and hard axes.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated.

DETAILED DESCRIPTION OF THE DRAWINGS

In the following detailed description of exemplary embodiments of the invention, reference is made to the accompanying drawings that form a part hereof, and in which is shown by way of illustration specific exemplary embodiments in which the invention may be practiced.

Figure 1:
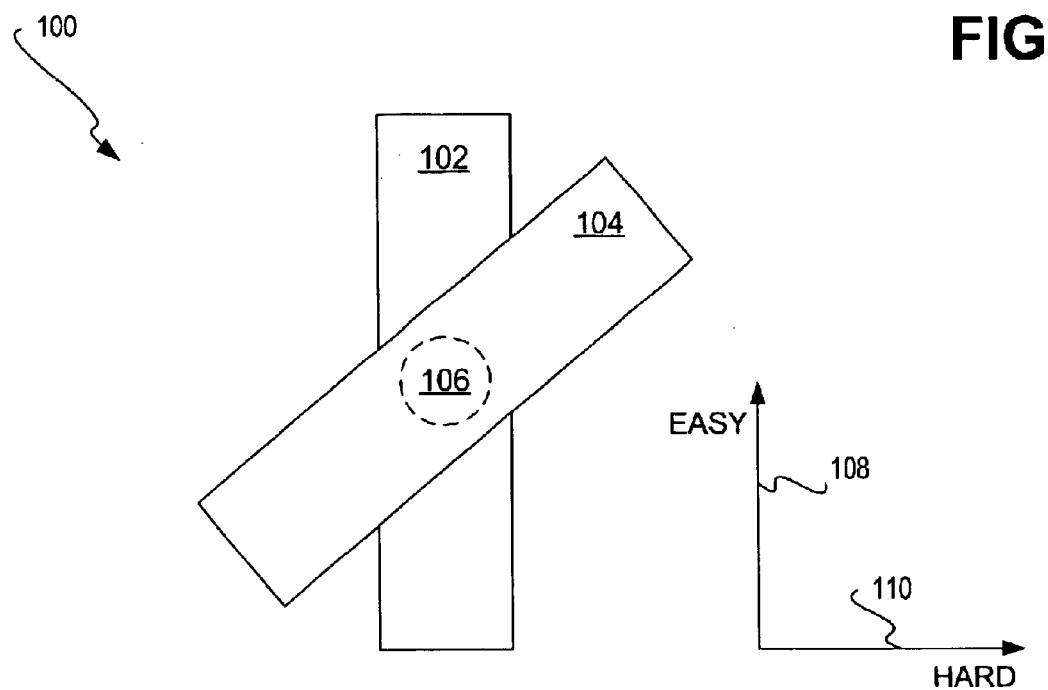
FIG. 1 is a diagram of the top view of a magnetic random-access memory (MRAM) cell, according to an embodiment of the invention.

FIG. 1 illustrates the top view of a magnetic random-access memory (MRAM) cell 100, according to an embodiment of the invention. The MRAM cell 100 includes a write conductor 102 situated under a write conductor 104. The read conductor(s) of the MRAM cell 100 are not shown in FIG. 1 for illustrative clarity. However, the write conductor 102 may in one embodiment also function as a read conductor. An easy axis 108 and a hard axis 110, which are perpendicular to one another are also, shown in FIG. 1.

The write conductor 102 is positioned along, or is parallel to, an easy axis 108. In an alternative embodiment, the write conductor 102 may be positioned along, or parallel to, a hard axis 110. The write conductor 104 is positioned at a non-parallel and non-perpendicular angle to both easy axis 108 and hard axis 110. Whereas the write conductor 104 is shown in the embodiment of FIG. 1 as rotated clockwise, or rotating to the right, relative to the write conductor 102, in an alternative embodiment the write conductor 104 may be rotated counter-clockwise, or rotated to the left, relative to the write conductor 102.

A magnetic storage element 106 is situated between the write conductor 102 and the write conductor 104. The magnetic storage element 106 can be said to have easy axis 108 and hard axis 110. The magnetic storage element 106 has a magnetic orientation indicative of a logical value that the MRAM cell 100 stores. The magnetic storage element 106 may have a parallel magnetic orientation and an anti-parallel magnetic orientation, for instance, corresponding to the logical values zero and one.

The positioning of the write conductor 104 at a non-parallel and non-perpendicular angle to both easy axis 108 and hard axis 110 promotes better selectivity when writing to the MRAM cell 100, or when switching the magnetic orientation of the MRAM cell 100. Such writing or switching is accomplished by biasing both the write conductor 102 and the write conductor 104. The biasing of the write conductor 102 induces a magnetic field along the conductor 102, and thus along easy axis 108. The biasing of the write conductor 104 likewise induces a magnetic field along the conductor 104, and thus at a non-parallel and non-perpendicular angle both the axes 108 and 110.

Figure 2:
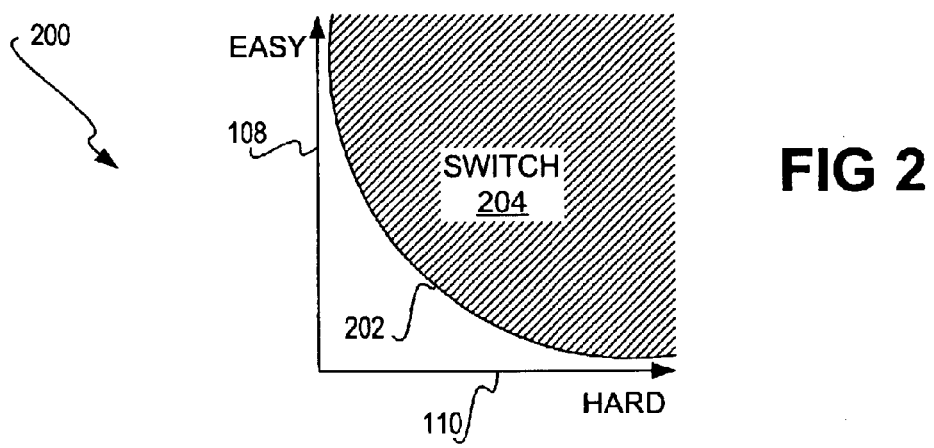
FIG. 2 is a graph showing when the MRAM cell of FIG. 1 switches magnetic orientation, according to an embodiment of the invention.

FIG. 2 shows a graph 200 illustrating when the MRAM cell 100 switches magnetic orientation in the presence of magnetic fields along easy axis 108 and hard axis 110, according to an embodiment of the invention. To one side of the line 202 is the switch region 204. When the magnetic fields along easy axis 108 and hard axis 110 are within the switch region 204, the magnetic orientation of the MRAM cell 100 switches from parallel to anti-parallel, or vice-versa. Thus, biasing the conductors 102 and 104 of FIG. 1 results in such magnetic fields within the switch region 204, preferably without resulting in such magnetic fields within the switch regions of any other MRAM cells near the write conductor 102 or the write conductor 104.

Figure 3A:
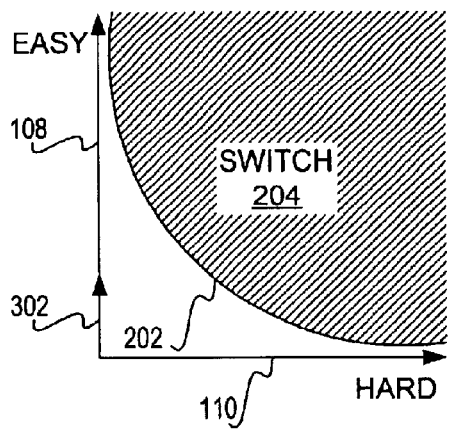
FIG. 3A is a graph showing the magnetic field vector on the magnetic storage element of FIG. 1 that results from biasing the write conductor of FIG. 1, according to an embodiment of the invention.

FIG. 3A shows a graph 300 illustrating the magnetic field vector 302 that results from biasing only the write conductor 102, relative to the line 202 and the switch region 204 it demarcates, according to an embodiment of the invention. The magnetic field vector 302 lies on easy axis 108, such that it has no component on hard axis 110. As a result, the magnetic field vector 302 resulting from biasing the write conductor 102 does not extend into the switch region 204, and by itself is insufficient to switch the magnetic orientation of any MRAM cells along the conductor 102, including the MRAM cell 100.

Figure 3B:
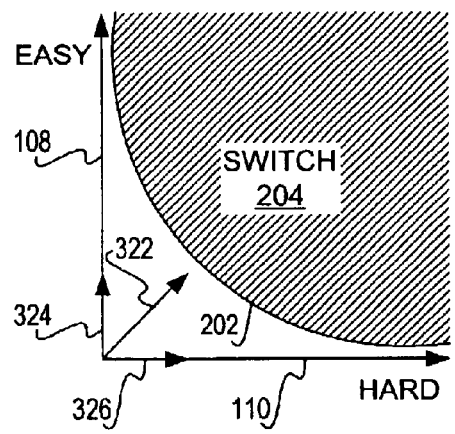
FIG. 3B is a graph showing the magnetic field vector on the magnetic storage element of FIG. 1 that results from biasing the write conductor of FIG. 1, according to an embodiment of the invention.

FIG. 3B shows a graph 320 illustrating the magnetic field vector 322 that results from biasing only the write conductor 104, relative to the line 202 and the switch region 204 it demarcates, according to an embodiment of the invention. The magnetic field vector 322 can be resolved into an easy component 324 along easy axis 108, and a hard component 326 along hard axis 110. However, the magnetic field vector 322 resulting from biasing the write conductor 104 has insufficient magnitude to extend into the switch region 204, and by itself is also insufficient to switch the magnetic orientation of any MRAM cells along the conductor 104, including the MRAM cell 100.

Figure 3C:
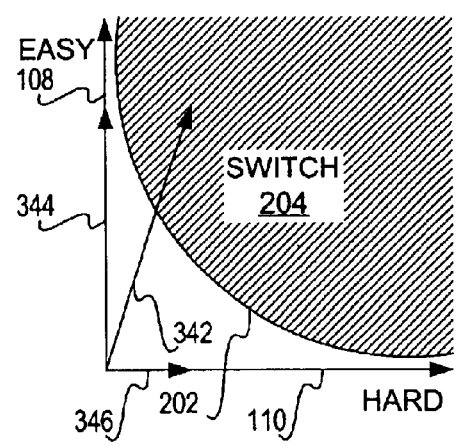
FIG. 3C is a graph showing the magnetic field vector on the magnetic storage element of FIG. 1 that results from biasing both write conductors of FIG. 1, according to an embodiment of the invention.

FIG. 3C shows a graph 340 illustrating the magnetic field vector 342 that results from biasing both the write conductor 102 and the write conductor 104, relative to the line 202 and the switch region 204 it demarcates, according to an embodiment of the invention. The magnetic field vector 342 is the sum of the magnetic field vector 302 of FIG. 3A resulting from the write conductor 102 alone, and the magnetic field vector 322 of FIG. 3B resulting from the write conductor 104 alone. The magnetic field vector can be resolved into an easy component 344 along easy axis 108, and a hard component 346 along hard axis 110. The easy component 344 is equal to the sum of the magnetic field vector 302 of FIG. 3A, where the vector 302 lies completely on easy axis 108, and the easy component 324 of the magnetic field vector 322 of FIG. 3B. The hard component 346 is equal to the hard component 326 of the magnetic field vector 322 of FIG. 3B, since the magnetic field vector 302 of FIG. 3A does not have a hard component.

The magnetic field vector 342 resulting from biasing both the write conductor 102 and the write conductor 104 extends into the switch region 204, and thus is sufficient to switch the magnetic orientation of the MRAM cell 100, which is the only MRAM cell along both the conductors 102 and 104. Other MRAM cells along the write conductor 102 do not have their orientations switched, since they are exposed to only the magnetic field vector 322 of FIG. 3A. Similarly, other MRAM cells along the write conductor 104 do not have their orientations switched, since they are exposed to only the magnetic field vector 324 of FIG. 3B. In this way, utilizing a write conductor that is positioned at a non-parallel and non-perpendicular angle to both easy axis 108 and hard axis 110—the write conductor 104—promotes better selectivity when writing to the MRAM cell 100.

Figure 4A:
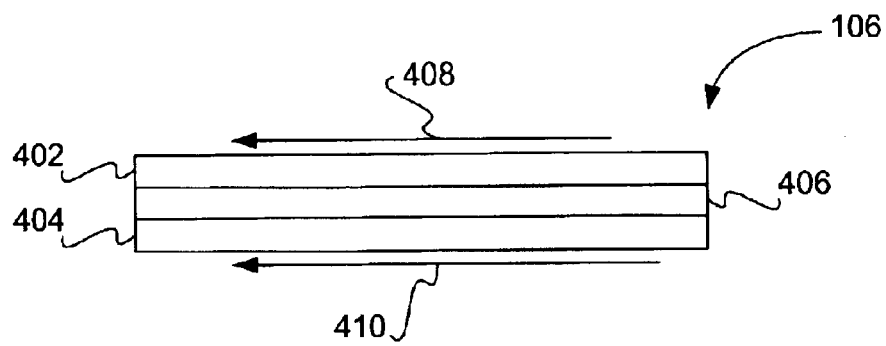
FIGS. 4A and 4B are simplified diagrams illustrating magnetic orientation of various layers of the magnetic storage element of FIG. 1, according to an embodiment of the invention.
Figure 4B:
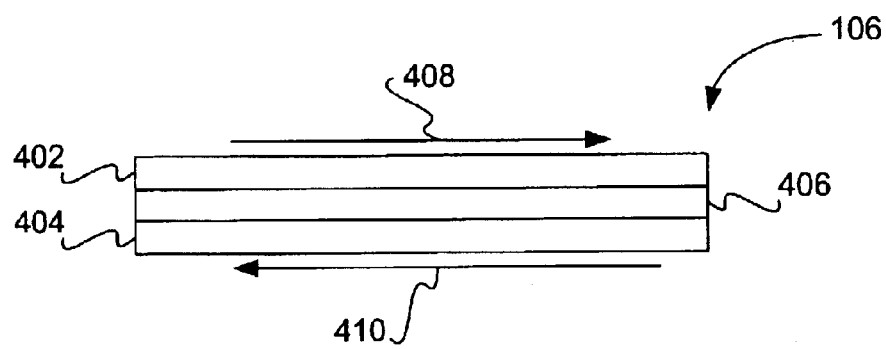

FIGS. 4A and 4B show simplified diagrams illustrating the magnetic storage element 106 of FIG. 1, according to a specific embodiment of the invention. The magnetic storage element 106 of the embodiment of FIGS. 4A and 4B is a spin-dependent tunneling (SDT) junction device. The element 106 includes a pinned layer 404 having a magnetization that is oriented in the plane of the layer 404, but which is fixed so as not to rotate in the presence of an applied magnetic field. The element 106 also includes a free layer 402 having a magnetization orientation that is not pinned or fixed. Rather, the magnetization can be oriented in either of two directions along the easy axis lying in the plane of the free layer 402. That is, the magnetization of the free layer 402 is rotatable, such that it can switch between its two directions.

If the magnetizations of the free layer 402 and the pinned layer 404 are in the same direction, then the orientation is said to be parallel, as is reflected by the arrows 408 and 410 pointing in the same direction in FIG. 4A. If the magnetizations of the free layer 402 and the pinned layer 404 are in opposite directions, then the orientation is said to be anti-parallel, as is reflected by the arrows 408 and 410 pointing in opposite directions in FIG. 4B. The magnetization in the free layer 402 may have its orientation changed by biasing the write conductors 102 and 104 of FIG. 1 as has been described.

An insulating tunnel barrier 406 preferably separates the free layer 402 and the pinned layer 404. The insulating tunnel barrier 406 allows quantum mechanical tunneling to occur between the layers 402 and 404. This tunneling phenomenon is electron-spin dependent, making the resistance of the magnetic storage element 106 a function of the relative orientations of the magnetizations of the free layer 402 and the pinned layer 404. For instance, the resistance of the element 106 may be a first value if the orientation of the magnetizations of the layers 402 and 404 is parallel, and a second value greater than the first value if the orientation is anti-parallel.

Figure 5A:
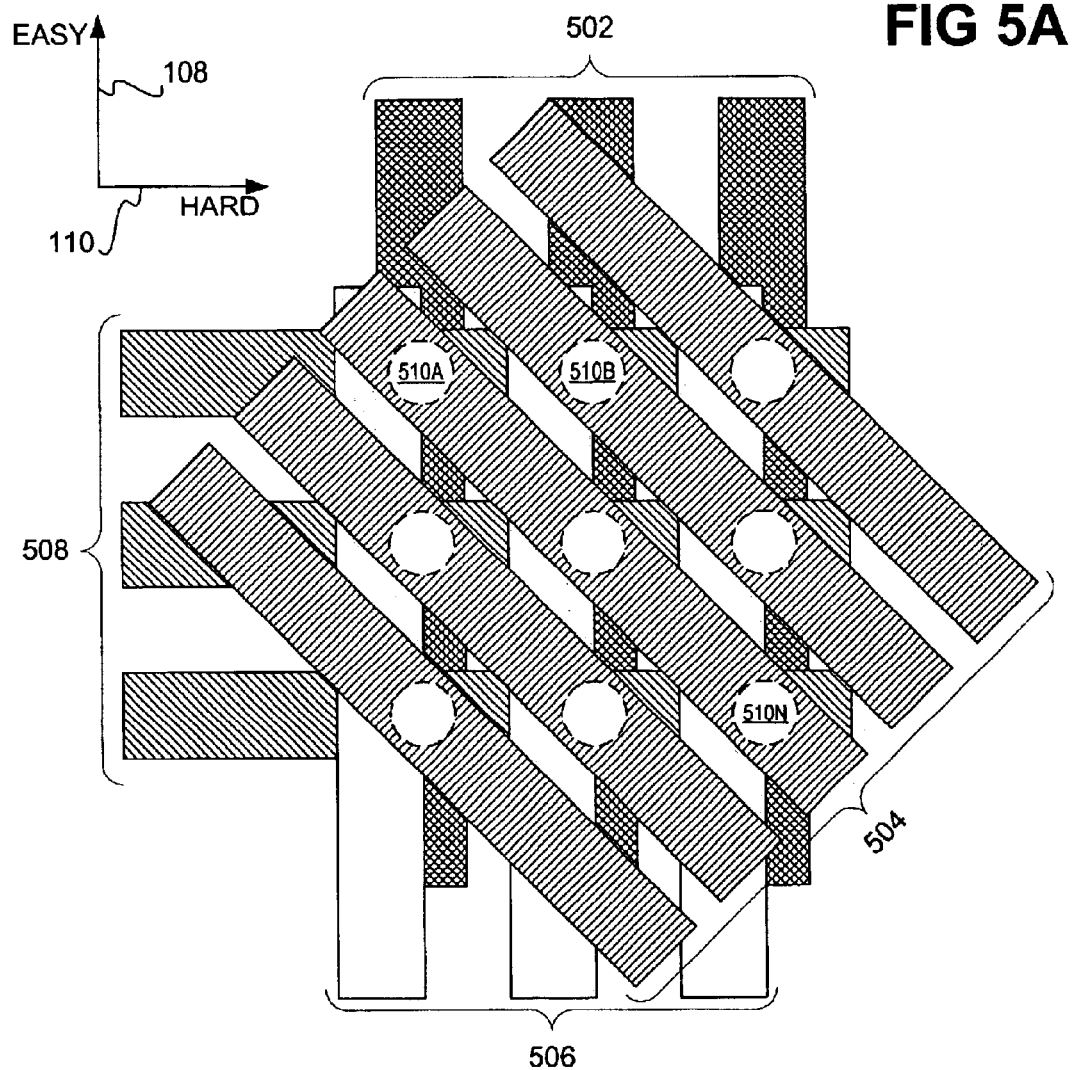
FIGS. 5A and 5B are simplified diagrams of an array of MRAM cells, according to an embodiment of the invention.
Figure 5B:
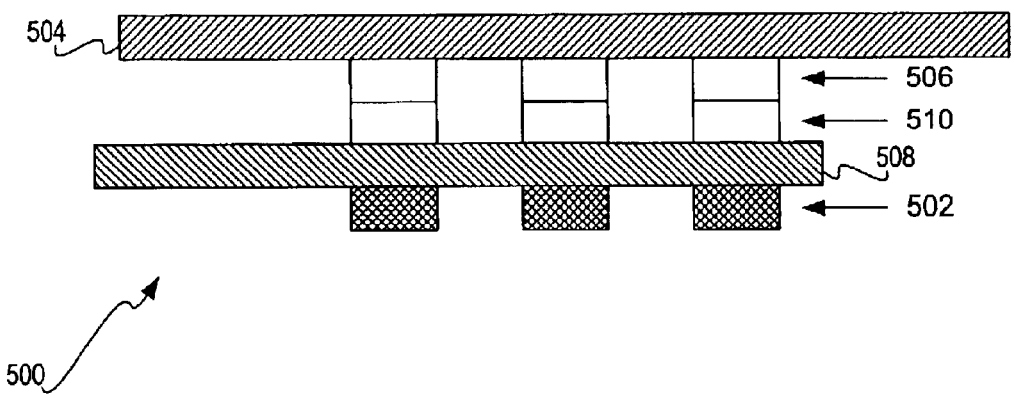

FIGS. 5A and 5B show an array of magnetic random-access memory (MRAM) cells 500, according to an embodiment of the invention. FIG. 5A is specifically a top view of the MRAM cells 500, whereas FIG. 5B is specifically a front view of the MRAM cells 500.

The MRAM cells 500 include a three-by-three array of magnetic storage elements 510A, 510B, ..., 510N, collectively referred to as the magnetic storage elements 510. Each of the magnetic storage elements 510 may be implemented as the storage element 106 of FIG. 4 that has been described. As can be appreciated by those of ordinary skill within the art, the MRAM cells 500 are likely to include hundreds, thousands, or more of such magnetic storage elements 510. Just nine of the magnetic storage elements 510 are depicted in FIG. 5A for purposes of illustrative clarity.

The MRAM cells 500 also include a number of write conductors 502 that are parallel to one another, and a number of write conductors 504 that are parallel to one another. Each of the write conductors 502 lies below a number of the magnetic storage elements 510, and can be implemented as the write conductor 102 of FIG. 1 that has been described. Each of the write conductors 504 lies above a number of the magnetic storage elements 510, and can be implemented as the write conductor 104 of FIG. 1 that has been described.

The write conductors 504 are positioned at a non-parallel and non-perpendicular angle relative to the write conductors 502, which are themselves positioned parallel to or along either easy axis 108 or hard axis 110. In FIG. 5A, the write conductors 502 are specifically positioned along easy axis 108. Whereas only three of the write conductors 502 and five of the write conductors 504 are depicted in FIG. 5A, this is for purposes of illustrative clarity, and in actuality the MRAM cells 500 include hundreds, thousands, or more of such conductors 502 and 504.

The MRAM cells 500 include a number of read conductors 506 that are parallel to one another, and a number of read conductors 508 that are also parallel to one another. Each of the read conductors 506 lies above a number of the magnetic storage elements 510, but below a corresponding one of the write conductors 504. The read conductors 506 and the write conductors 502 are depicted in FIG. 5A as slightly offset relative to one another only for illustrative clarity. In actuality, they are not offset from one another, as depicted in FIG. 5B. Each of the read conductors 508 lies below a number of the magnetic storage elements 510, but above a corresponding one of the write conductors 502.

The read conductors 506 and the read conductors 508 are positioned perpendicular to one another. The read conductors 506 are specifically positioned along easy axis 108 in FIG. 5A, whereas the read conductors 508 are specifically positioned along hard axis 110 in FIG. 5A. However, in an alternative embodiment, the read conductors 506 may be positioned along hard axis 110 and the read conductors 508 along easy axis 108. Whereas only three of the read conductors 506 and three of the read conductors 508 are depicted in FIG. 5A, this is for purposes of illustratively clarity, and in actuality the MRAM cells 500 include hundreds, thousands, or more of such conductors 506 and 508.

In another alternative embodiment of the invention, the read conductors 506 are not present, such that the write conductors 502 assume both read and write functional roles. Thus, this alternative embodiment of the invention is a three-conductor array MRAM cells, because the MRAM cells 500 include three different types of conductors: write conductors 502, write conductors 504, and read conductors 508. However, in the embodiment actually depicted in FIGS. 5A and 5B, the array of MRAM cells 500 is a four-conductor storage device including four different types of conductors: write conductors 502, write conductors 504, read conductors 506, and read conductors 508. Furthermore, it is noted that in another alternative embodiment of the invention, the MRAM cells 500 are not organized in an array. That is, the MRAM cells 500 are organized as an array in the embodiment of FIG. 5 as an example, and not as a limitation on all embodiments of the invention.

Figure 6:
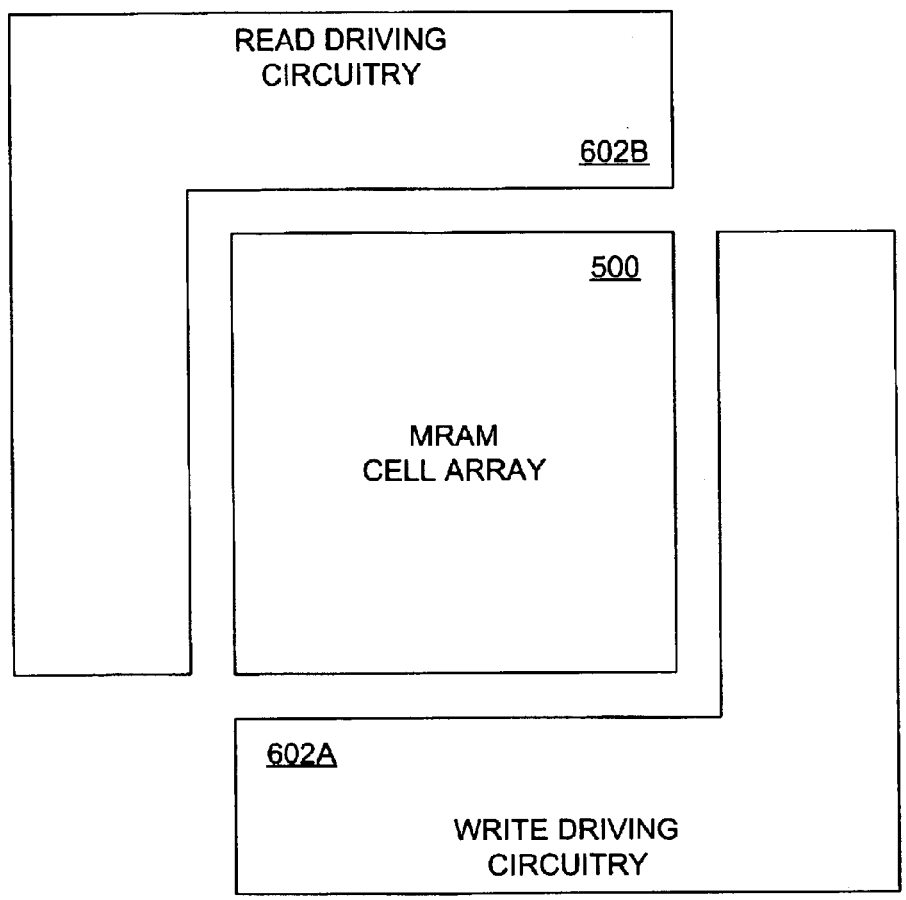
FIG. 6 is a diagram of a representative MRAM storage device, according to an embodiment of the invention.

FIG. 6 shows a representative MRAM storage device 600 that utilizes the array of MRAM cells 500 of FIG. 5, according to an embodiment of the invention. The MRAM storage device 600 includes write driving circuitry 602A and read driving circuitry 602B. The write driving circuitry 602A and read driving circuitry 602B are collectively referred to as the driving circuitry 602. The driving circuitry 602 enables the selective writing of logical values to, and the selective writing of logical values from, the array of MRAM cells 500. Specifically, the write driving circuitry 602A provides for the selective writing of logical values to the MRAM cells 500, whereas the read driving circuitry 602B provides for the selective reading of logical values from the MRAM cells 500.

Figure 7:
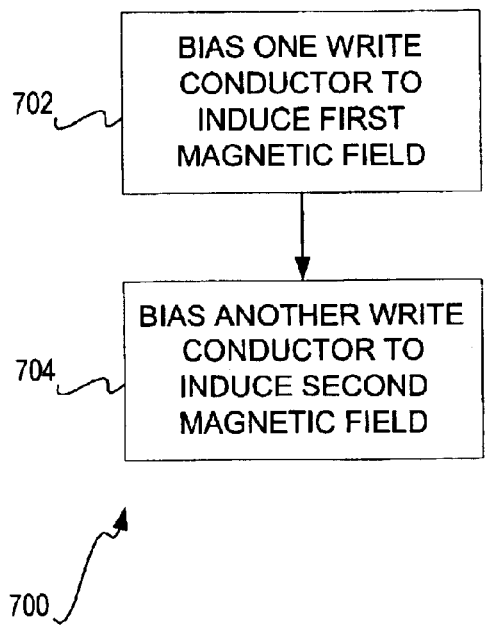
FIG. 7 is a flowchart of a method for writing a logical value to an MRAM memory cell of an MRAM storage device, according to an embodiment of the invention.

FIG. 7 illustrates a method 700 for writing to a magnetic random-access memory (MRAM) cell, according to an embodiment of the invention. The method 700 can be performed by the write driving circuitry 602A of FIG. 6 in one embodiment. For a selected MRAM cell of an array of MRAM cells, write conductor 102/502 that passes under the MRAM cell is biased (702). This causes a current to flow through write conductor 102/502, inducing a first magnetic field. Similarly, write conductor 104/504 that passes over the MRAM cell is biased (704), which causes a current to flow through write conductor 104/504, inducing a second magnetic field. The combination of the first and the second magnetic fields is sufficient to switch the magnetic orientation of the MRAM cell, switching the value stored in the cell from logical zero to logical one, or vice-versa. The other MRAM cells along the write conductors are not affected, because they are subjected to only the first or the second magnetic field, and not both fields simultaneously.

Figure 8:
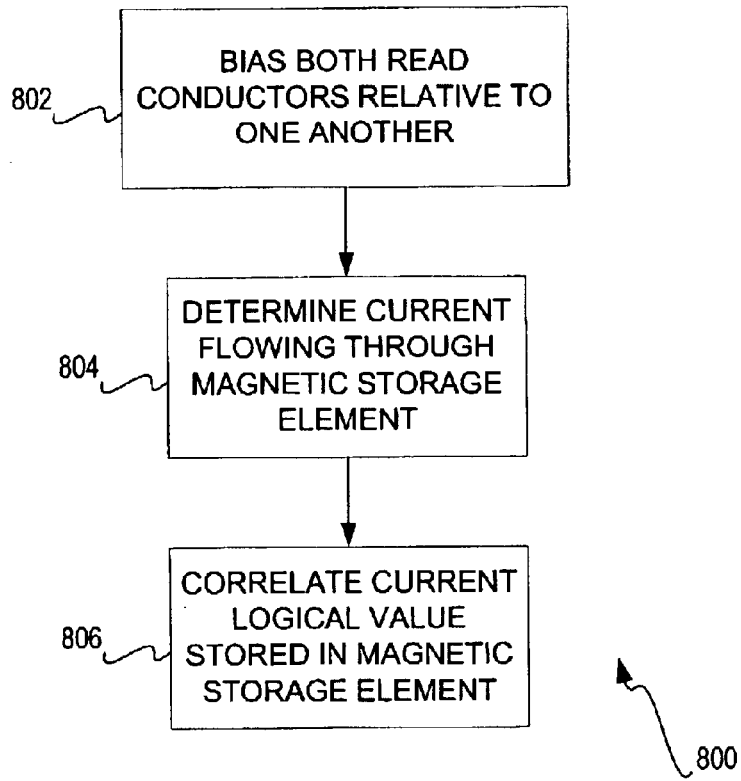
FIG. 8 is a flowchart of a method for reading a logical value from an MRAM memory cell of an MRAM storage device, according to an embodiment of the invention.

FIG. 8 illustrates a method 800 for reading an MRAM cell, according to an embodiment of the invention. The method 800 can be performed by the read driving circuitry 602B of FIG. 6 in one embodiment. For a selected MRAM cell of an array of MRAM cells, read conductor 506 passing over the MRAM cell is biased relative to read conductor 508 passing under the MRAM cell, or vice-versa (802). This causes a current to flow from read conductor 506, through the MRAM cell, and back through read conductor 508, or from read conductor 508, through the MRAM cell, and back through read conductor 506. This current, which flows through the magnetic storage element of the MRAM cell, is then determined, or measured (804).

The resistance of the magnetic storage element of the MRAM cell is based on the logical value stored by the MRAM cell. That is, the resistance of the magnetic storage element is based on the magnetic orientation of the MRAM cell. The resistance may be a first value if the magnetic orientation is parallel, and a second value if the magnetic orientation is anti-parallel. Furthermore, because the read conductors are biased at a constant level relative to one another, this means that the current flowing through the MRAM cell is based on the resistance of the MRAM cell, since current is equal to voltage divided by resistance.

Therefore, the current determined or measured is correlated to the logical value stored in the magnetic storage element of the MRAM cell (806). For instance, a current of a first value may correspond to the magnetic orientation being parallel, which may represent a logical zero being stored by the MRAM cell. A current of a second value may correspond to the magnetic orientation being anti-parallel, which may represent a logical one being stored by the MRAM cell. In this way, the method 800 reads the logical value stored by the MRAM cell.

What is claimed is:

1. A magnetic random-access memory (MRAM) cell comprising:

a magnetic storage element having an easy axis and a hard axis;

a write conductor positioned along one of the easy axis and the hard axis; and, a write conductor positioned at a non-parallel and non-perpendicular angle to both of the easy axis and the hard axis.

2. The MRAM cell of claim 1, further comprising:

a read conductor positioned along one of the easy axis and the hard axis; and, a read conductor positioned along another of the easy axis and the hard axis.

3. The MRAM cell of claim 1, wherein the magnetic storage element comprises:

a pinned layer having a fixed magnetization oriented along the easy axis in a first direction; and, a free layer having a rotatable magnetization switchably oriented along the easy axis in one of the first direction and a second direction that is opposite to the first direction.

4. The MRAM cell of claim 1, wherein the write conductor positioned along one of the easy axis and the hard axis is positioned along the easy axis.

5. A method for writing a value to a magnetic random-access memory (MRAM) cell comprising:

biasing a write conductor of the MRAM cell positioned along one of an easy axis and a hard axis of the MRAM cell; and, biasing a write conductor of the MRAM cell positioned at a non-parallel and non-perpendicular angle to both of the easy axis and the hard axis of the MRAM cell.

6. The method of claim 5, wherein biasing both of the write conductors switches orientation of a rotatable magnetization of a free layer of the MRAM cell from along one of the easy axis and the hard axis to along another of the easy axis and the hard axis, the orientation of the rotatable magnetization of the free layer corresponding to the value written to the MRAM cell.

7. The method of claim 5, wherein biasing the write conductors comprises causing a current to flow within the respective write conductor.

8. A magnetic random-access memory (MRAM) storage device comprising:

a plurality of magnetic storage elements having an easy axis and a hard axis;

a set of parallel write conductors, all of which are positioned along one of the easy axis and the hard axis; and, a set of parallel write conductors, all of which are positioned at a non-parallel and non-perpendicular angle to both of the easy axis and the hard axis.

9. The MRAM storage device of claim 8, further comprising:

a set of parallel read conductors, all of which are positioned along one of the easy axis and the hard axis; and, a set of parallel read conductors, all of which are positioned along another of the easy axis and the hard axis.

10. The MRAM storage device of claim 8, further comprising driving circuitry to selectively read values from and selectively write values to the plurality of magnetic storage elements.

11. The MRAM storage device of claim 8, wherein each magnetic storage element comprises:

a pinned layer having a fixed magnetization oriented along the easy axis in a first direction; and, a free layer having a rotatable magnetization switchably oriented along the easy axis in one of the first direction and a second direction that is opposite to the first direction.

12. The MRAM storage device of claim 8, wherein the set of parallel write conductors positioned along one of the easy axis and the hard axis is positioned along the easy axis.

* * * * *